US008877083B2

(12) United States Patent
Chou et al.

(10) Patent No.: US 8,877,083 B2
(45) Date of Patent: Nov. 4, 2014

(54) SURFACE TREATMENT IN THE FORMATION OF INTERCONNECT STRUCTURE (71) Applicant: Taiwan Semiconductor Manufacturing Company, Ltd., Hsin-Chu (TW)

(72) Inventors: Chia-Cheng Chou, Keelung (TW);
Mei-Ling Chen, Hsin-Chu (TW);
Hui-Chun Yang, Hsin-Chu (TW);
Po-Cheng Shih, Hsin-Chu (TW);
Joung-Wei Liou, Zhudong (TW);
Shwang-Ming Jeng, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 21 days.

(21) Appl. No.: 13/679,858

(22) Filed: Nov. 16, 2012

(65) Prior Publication Data
US 2014/0141611 A1 May 22, 2014

(51) Int. Cl.
B44C 1/22 (2006.01)
H01L 21/302 (2006.01)
H01L 21/306 (2006.01)

(52) U.S. Cl.
CPC ........ H01L 21/302 (2013.01); H01L 21/30625 (2013.01)
USPC ................ 216/88; 216/89; 438/692; 438/693

(58) Field of Classification Search
CPC ............ H01L 21/3105; H01L 21/3212; H01L 21/76807; H01L 21/76825; H01L 21/76828; H01L 21/02348; B08B 7/0057
USPC ............................... 216/88, 89; 438/692, 693
See application file for complete search history.

(56) References Cited

U.S. PATENT DOCUMENTS

| 6,319,809 | B1* | 11/2001 | Chang et al. ............... 438/597 |
| 8,242,028 | B1* | 8/2012 | Van Schravendijk et al. .......................... 438/763 |
| 2005/0287787 | A1* | 12/2005 | Kloster et al. ............... 438/618 |
| 2006/0097394 | A1* | 5/2006 | Filippi et al. ................. 257/758 |
| 2010/0301495 | A1* | 12/2010 | Chikaki ........................ 257/774 |
| 2011/0111533 | A1* | 5/2011 | Varadarajan et al. ............ 438/4 |
| 2012/0205814 | A1* | 8/2012 | Wu et al. ...................... 257/774 |
| 2012/0289049 | A1* | 11/2012 | Ye et al. ....................... 438/694 |

* cited by examiner

Primary Examiner — Shamim Ahmed
(74) Attorney, Agent, or Firm — Slater & Matsil, L.L.P.

(57) ABSTRACT

A Ultra-Violet (UV) treatment is performed on an exposed surface of a low-k dielectric layer and an exposed surface of a metal line. After the UV treatment, an organo-metallic soak process is performed on the exposed surface of the low-k dielectric layer and the exposed surface of the metal line. The organo-metallic soak process is performed using a process gas including a metal bonded to an organic group.

20 Claims, 6 Drawing Sheets

SURFACE TREATMENT IN THE FORMATION OF INTERCONNECT STRUCTURE

BACKGROUND

Low-k dielectric materials are used in the formation of interconnect structures in integrated circuits. Copper lines are used in the interconnect structures. Copper lines can be formed using damascene processes, in which a Chemical Mechanical Polish (CMP) is performed for planarization. In the conventional formation processes of the interconnect structures, after the CMP, a pre-heating and a pre-treatment were performed. An organo-metallic soak was performed using Tri-Methyl-Aluminum (TMA) on the exposed surfaces of copper and the low-k dielectric layer in which the copper is disposed. A pin treatment is then performed using a bonding agent. The organo-metallic soak process and the pin treatment may be repeated. After the organo-metallic soak and the pin treatment, a dielectric etch stop layer is formed on the low-k dielectric material and copper.

The organo-metallic soak process and the pin treatment promote the adhesion of the dielectric etch stop layer to the underlying copper and low-k dielectric layer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
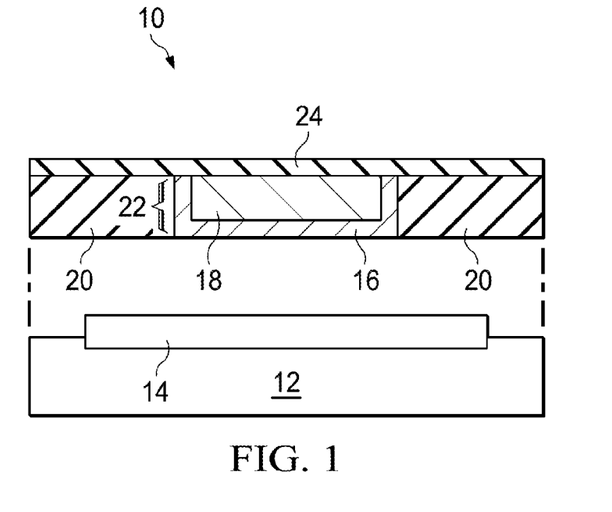
FIGS. 1 through 7 are cross-sectional views of intermediate stages in the manufacturing of an interconnect structure in accordance with some exemplary embodiments.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, III-V compound semiconductor materials, and/or the like. In some embodiments, integrated circuits 14 are formed at a top surface of semiconductor substrate 12. Integrated circuits 14 may include active devices such as transistors.

Over integrated circuit 14 is dielectric layer 20, and conductive line 22 formed in dielectric layer 20. Dielectric layer 20 may be an Inter-Layer Dielectric (ILD) layer or an Inter-Metal Dielectric (IMD) layer, and may have low dielectric constants (k values) lower than about 2.5, for example. Conductive line 22 may include a conductive barrier layer 16 and metal line 18 over barrier layer 16. In some embodiments, barrier layer 16 comprises titanium, titanium nitride, tantalum, tantalum nitride, copper manganese, alloys thereof, and/or multi-layers thereof. Metal line 18 may comprise copper, tungsten, aluminum, nickel, and/or alloys thereof. Conductive line 22 may be electrically coupled to integrated circuits 14 and may serve as the interconnection between the devices in integrated circuits 14.

Etch Stop Layer (ESL) 24 may be formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDPCVD), Atomic Layer CVD (ALCVD), and the like. In alternative embodiments, dielectric layer 24 is a diffusion barrier layer that is used for preventing undesirable elements, such as copper, from diffusing into the subsequently formed low-k dielectric layer. In further embodiments, dielectric layer 24 acts as both an etch stop layer and a diffusion barrier layer.

Figure 2:
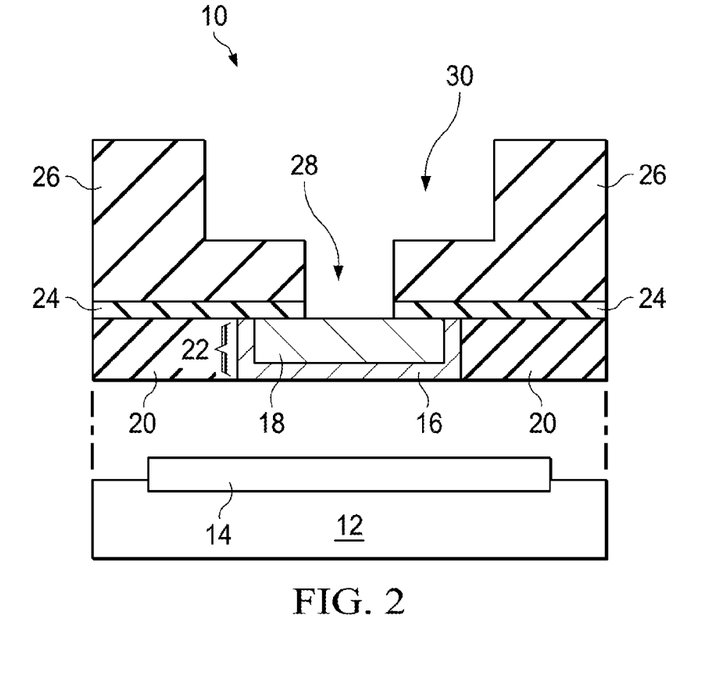

FIG. 2 illustrates the formation of low-k dielectric layer 26, which provides insulation between conductive line 22 and the overlying conductive lines that will be formed subsequently. Accordingly, low-k dielectric layer 26 is sometimes referred to as an Inter-Metal Dielectric (IMD) layer. Low-k dielectric layer 26 may have a k value lower than about 3.5, or lower than about 2.5. The materials comprised in low-k dielectric layer 26 may include carbon-containing materials, organo-silicate glass, porogen-containing materials, and/or combinations thereof. Low-k dielectric layer 26 may be deposited using PECVD, although other commonly used deposition methods, such as Low Pressure CVD (LPCVD), ALCVD, and spin-on, can also be used.

FIG. 2 also illustrates the formation of via opening 28 and a trench opening 30 in low-k dielectric layer 26. Photo resists (not shown) may be formed and patterned over low-k dielectric layer 26 to aid the formation of via opening 28 and trench opening 30. In some exemplary embodiments, an anisotropic etch is performed to cut through low-k dielectric layer 26, which anisotropic etch stops on ESL 24, thereby forming via opening 28. Trench opening 30 is then formed by etching low-k dielectric layer 26 using another patterned photo resist. Since there is no etch stop layer for stopping the etch step for forming trench opening 30, etching time is controlled so that the etch step for forming trench opening 30 stops at a desired depth. In alternative embodiments, a trench-first approach is taken, in which trench opening 30 is formed prior to the formation of via opening 28. ESL 24 is then etched through via opening 28, exposing underlying conductive line 22.

In alternative embodiments, the previously discussed low-k dielectric layer 26 is replaced by a first low-k dielectric layer (not shown), an ESL (not shown) over the first low-k dielectric layer, and a second low-k dielectric layer (not shown) over the ESL. One skilled in the art will realize the appropriate process steps.

Figure 3:
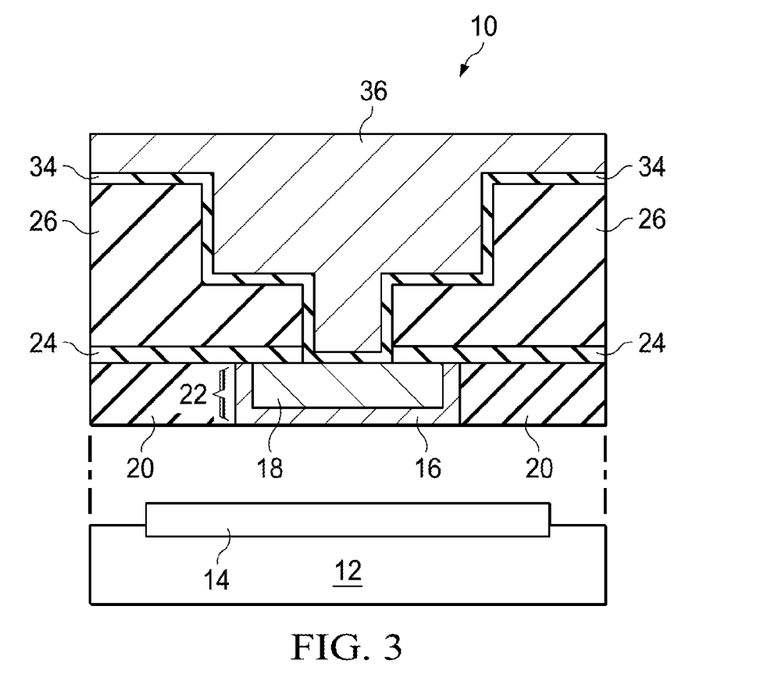

FIG. 3 illustrates the formation of conductive barrier layer 34, and conductive material 36 over barrier layer 34. Conductive barrier layer 34 extends into openings 28 and 30 (FIG. 2), and includes a portion over low-k dielectric layer 26. Conductive barrier layer 34 also has a bottom portion contacting the top surface of conductive line 22. Barrier layer 34 prevents the copper in conductive material 36 from diffusing into low-k dielectric layer 26. In some embodiments, conductive barrier layer 34 is formed of a conductive material comprising titanium, titanium nitride, tantalum, tantalum nitride, copper manganese, alloys thereof, or multi-layers thereof.

As also shown in FIG. 3, the remaining portions of via opening 28 and trench opening 30 (FIG. 2) that are not occupied by conductive barrier 34 are filled with conductive material 36, which may be a copper-containing material such as substantially pure copper or copper alloys. Other metals and metal alloys such as aluminum and tungsten may also be used or added into copper. The top surface of conductive material 36 is higher than the top surface of low-k dielectric layer 26.

Figure 4:
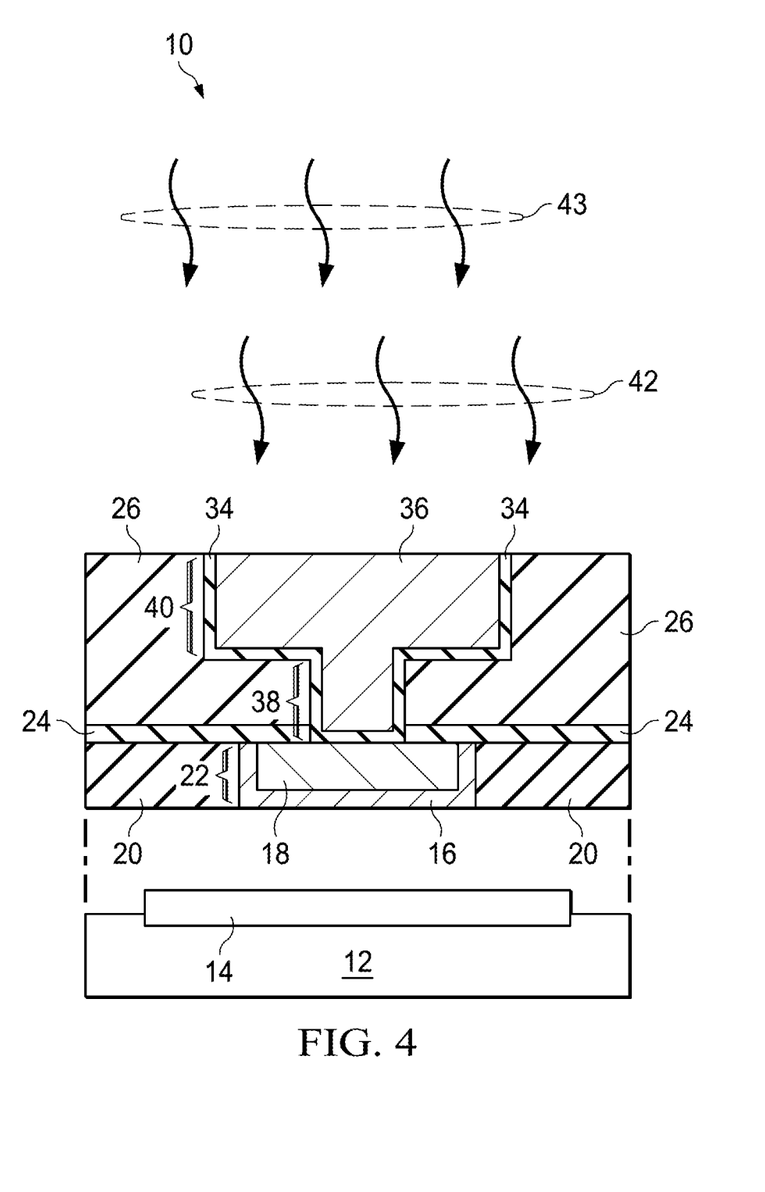

Referring to FIG. 4, a planarization such as Chemical Mechanical Polish (CMP) is performed to remove excess portions of conductive barrier layer 34 and conductive material 36, until the portions of conductive material 36 over low-k dielectric layer 26 removed. In the resulting structure, a dual damascene structure is formed, wherein the dual damascene structure includes via 38 and metal line 40. Each of via 38 and metal line 40 includes a respective portion of conductive material 36 and the corresponding underlying portions of barrier layer 34.

In the previously discussed embodiments, the formation of a dual damascene structure is illustrated. Similar process and materials as discussed in the embodiments can also be adopted in the formation of single damascene structures.

Next, as shown in FIG. 4, the structure in FIG. 3 may be subject to a pre-heating process, which is symbolized by arrows 42. In some embodiments, the pre-heating process is performed in a process gas containing nitrogen ($N_2$), wherein the pressure of the process gas may be between about 1 Torr and about 3 Torr. In the pre-heating, the temperature of wafer 10 may be between about 300° C. and about 400° C. The pre-heating duration may be between about 20 seconds and about 30 seconds. It is appreciated, however, that the values recited throughout the description are merely examples, and may be changed to different values.

A pre-treatment may also be performed, which is also illustrated using arrows 42. In some embodiments, the pre-treatment process is performed in a process gas containing ammonia ($NH_3$), wherein the pressure of the process gas may be between about 1 Torr and about 3 Torr. During the pre-treatment process, the temperature of wafer 10 may be between about 300° C. and about 400° C. The pre-treatment time may be between about 10 seconds and about 20 seconds. In some embodiments, in addition to the heating, plasma may also be generated from the process gas for the pre-treatment. The pre-heating and the pre-treatment may help reduce the number of Si—O bonds on the surface of the structure in FIG. 4, and may help generate CuN at the surface of metal line 40.

A Ultra-Violet (UV) treatment is then performed on the structure shown in FIG. 4, wherein the UV treatment is performed using UV light 43. In some embodiments, UV light 43 has a wavelength between about 300 nm and about 400 nm, although the UV light with longer or shorter wavelengths may be used. The UV treatment duration may be between about 20 seconds and about 3 minutes. The process gas may include a gas comprising $N_2$, $H_2$, Ar, and combinations thereof. The temperature of wafer 10 may be between about 300° C. and about 400° C. during the UV treatment. The UV treatment help to remove moisture (or 0, OH, and the like) that is not removed in the pre-heating and pre-treatment process (if any). With the UV treatment, the likelihood of forming undesirable AlON on the surface of the structure in FIG. 4 in the subsequent process steps is reduced.

Figure 5:
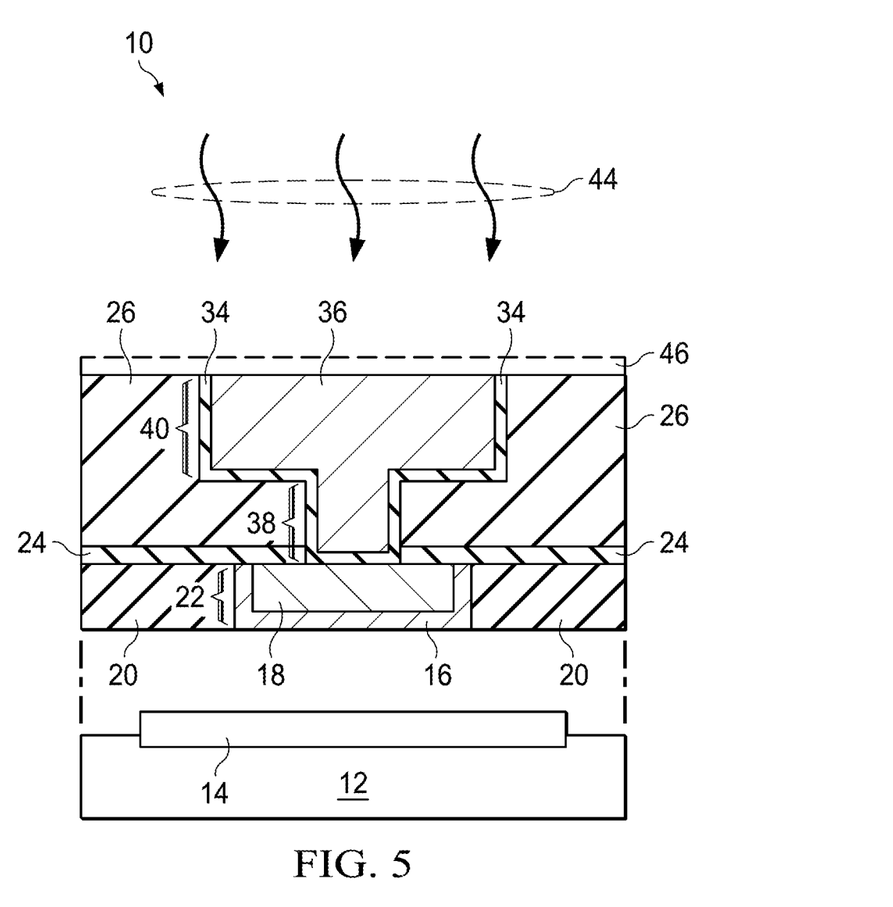

FIG. 5 illustrates an organo-metallic soak process, as illustrated by arrows 44. The process gas for the organo-metallic soak may include an organo-metallic gas that comprises a metal (such as aluminum) bonded to an organic group (such as $CH_3$). For example, the process gas for the organo-metallic soak may include $Al(CH_3)_3$. In some embodiments, during the organo-metallic soak process, the pressure of the process gas is between about 0.1 Torr and about 2 Torr. The temperature of wafer 10 may be between about 300° C. and about 400° C. The soak time may be between about 6 seconds and about 12 seconds. Plasma may be, or may not be, applied during the organo-metallic soak process.

As a result of the organo-metallic soak process, the material contained in the process gas, such as $Al(CH_3)_3$, is deposited on the surface of metal line 40 and low-k dielectric layer 26, wherein the deposited material is illustrated as layer 46, although the deposited material may be very thin.

Figure 6:
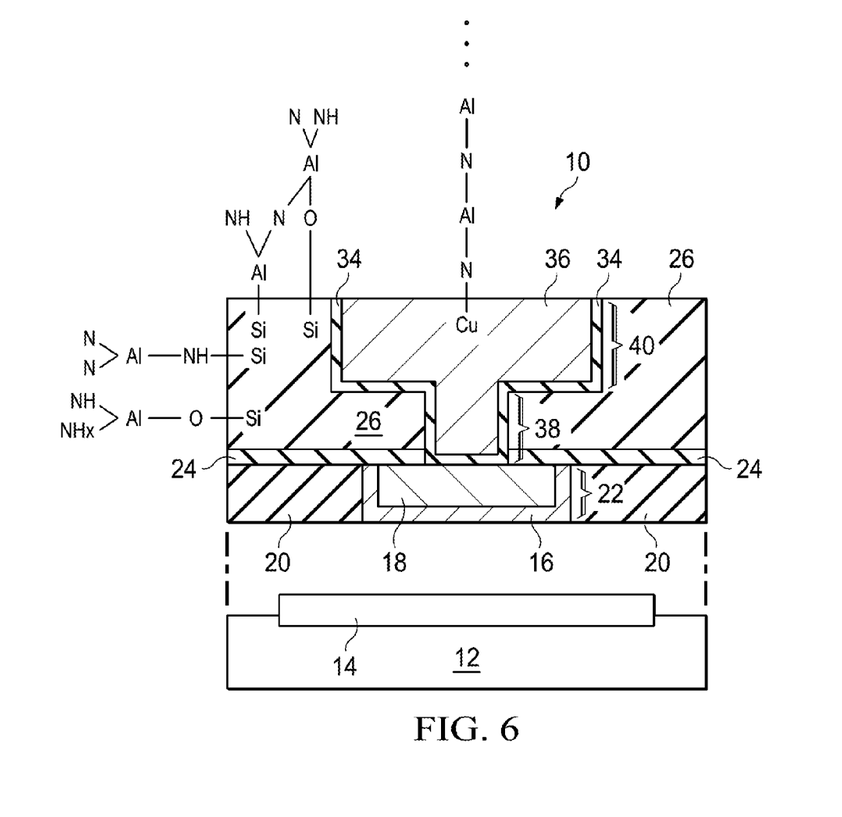

Next, referring to FIG. 6, a pin treatment is performed. In the pin treatment, ammonia and nitrogen ($N_2$) may be used as the treatment gas. In some embodiments, the ratio of the flow rate of nitrogen to the flow rate of ammonia is between about 0.5 and 4. During the pin treatment, the pressure of the process gas is between about 0.5 Torr and about 10 Torr. The temperature of wafer 10 may be between about 300° C. and about 400° C. The pin treatment time may be between about 6 seconds and about 12 seconds. Plasma may be applied during the organo-metallic soak process in some embodiments.

As a result of the pin treatment, the bonds between the organic groups and the metal in the deposited layer 46, which organic groups and the metal may be $CH_3$ and aluminum, respectively, are broken, and the organic groups are removed (for example, evacuated from the respective chamber). The metal, such as aluminum, forms bonds with nitrogen in ammonia, which may further bond with copper in metal line 40. For example, Cu—N—Al bonds may be formed, and additional N—Al bonds may be connected to the aluminum in Cu—N—Al, for example, forming Cu—N—Al—N—Al, Cu—N—Al—N—Al—N—Al, or similar bond. The organo-metallic soak process and the pin treatment process form a cycle. In some embodiments, the cycle is repeated to add more N—Al bonds, with each additional cycle including an organo-metallic soak process followed by a pin treatment process. FIG. 6 illustrate some exemplary bonds on the surface of low-k dielectric layer 26 and metal line 40.

After the cycle(s) including the organo-metallic soak process and the pin treatment process, an anneal is performed. During the anneal, the temperature of wafer 10 may be between about 350° C. and 400° C. The process may be selected from heating in a heater chamber (which may be a chamber used for Chemical Vapor Deposition (PECVD)), a furnace anneal, a Rapid Thermal Process (RTP), and combinations thereof. The duration of the anneal may be between about 1 minute and about 3 minutes, for example. The anneal is performed using $N_2$ as process gas. No plasma is applied. The anneal help remove residue $CH_3$ at the surface of low-k dielectric layer 26 and metal line 40, which residue $CH_3$ are introduced during the organo-metallic soak process.

Figure 7:
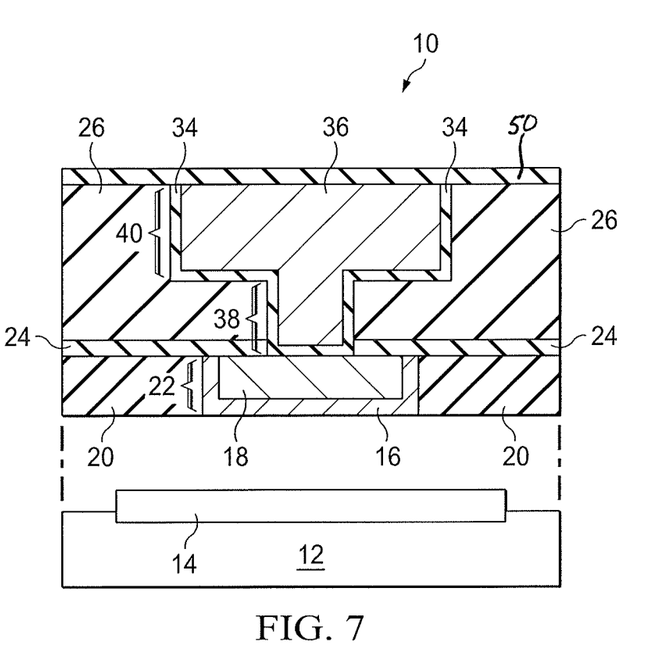

FIG. 7 illustrates the formation of ESL 50. In some embodiments, ESL 50 comprises a material selected from silicon carbonitride, silicon nitride, silicon carbide, an oxide, an oxynitride, and combinations thereof. The formation may be performed through PECVD, for example. With the preceding organo-metallic soak process and the pin treatment process, the adhesion between ESL 50 and underlying materials including metal line 40 and low-k dielectric layer 26 is improved.

In the embodiments, the UV treatment process may remove moisture in the surface portion of low-k dielectric layer 26. As a result, in subsequent organo-metallic soak process and the pin treatment process, Al—N bonds, rather than the undesirable Al—O—N bonds, are formed. Experiment results have confirmed the reduction of AlON formation. The AlON is undesirable since it results in the leakage in the interconnect structure, and results in the worsening of Time Dependent Dielectric Breakdown (TDDB) performance of the interconnect structure. Experiments were performed, and three samples were made and measured, whose results are compared with each other. The first sample was made with no organo-metallic soak process, no pin treatment process, and no UV treatment performed. The second sample was made with the organo-metallic soak process and pin treatment process performed, but with no UV treatment performed. The third sample was made with the organo-metallic soak process, the pin treatment process, and the UV treatment performed. Experiment results indicated that the leakage current (between 5 E-11 amps and 9E-11 amps) in the third sample is lower than the leakage current (between 3E-10 amps and 6E-10 amps) in the first sample, which is further lower than the leakage current (between amps 8E-10 and 3E-9 amps) in the second sample. This indicates that the organo-metallic soak process and pin treatment process cause the increase in the leakage currents, and the UV treatment has the effect of reducing the leakage currents.

Furthermore, the anneal after the organo-metallic soak process and pin treatment process in accordance with embodiments result in the improvement in the yield. Three groups of samples were also formed, wherein the samples include metal films. The first group of samples was made with no organo-metallic soak process, no pin treatment process, and no anneal performed. The second group of samples was made with the organo-metallic soak process and pin treatment process performed, but with no anneal performed. The third group of samples was made with the organo-metallic soak process, the pin treatment process, and the anneal performed. Cumulative failure rates of the three groups of samples were measured as a function of resistances of the metal films. It was observed that first and the third groups of samples have comparable resistances and cumulative failure rates. On the other hand, the second groups of samples have resistances and cumulative failure rates worse than that of the first and the second groups of samples. This indicates that the organo-metallic soak process and pin treatment process cause the worsening of the yield and the resistance, and the anneal in accordance with embodiments has the effect of improving the yield and the resistance.

In accordance with embodiments, a Ultra-Violet (UV) treatment is performed on an exposed surface of a low-k dielectric layer and an exposed surface of a metal line. After the UV treatment, an organo-metallic soak process is performed on the exposed surface of the low-k dielectric layer and the exposed surface of the metal line. The organo-metallic soak process is performed using a process gas including a metal bonded to an organic group.

In accordance with other embodiments, a method includes performing a cycle including steps of performing an organo-metallic soak process on an exposed surface of a low-k dielectric layer and an exposed surface of a metal line, and performing a pin treatment on the exposed surface of the low-k dielectric layer and the exposed surface of the metal line. After the cycle, an anneal is performed on the low-k dielectric layer and the metal line. After the anneal, a dielectric etch stop layer is formed over the low-k dielectric layer and the metal line.

In accordance with yet other embodiments, a method includes performing a CMP to form a metal line in a low-k dielectric layer, performing a UV treatment on an exposed surface of the low-k dielectric layer and an exposed surface of the metal line after the CMP. After the UV treatment, a cycle is performed. The cycle includes performing an organo-metallic soak process on the exposed surface of the low-k dielectric layer and the exposed surface of the metal line, wherein a process gas for the organo-metallic soak process comprises $Al(CH_3)_3$, and performing a pin treatment on the exposed surface of the low-k dielectric layer and the exposed surface of the metal line, wherein ammonia is used as a process gas. After the cycle, an anneal is performed on the low-k dielectric layer and the metal line. After the anneal, a dielectric etch stop layer is formed over the low-k dielectric layer and the metal line.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a Ultra-Violet (UV) treatment on an exposed surface of a low-k dielectric layer and an exposed surface of a metal line; and
    after the UV treatment, performing an organo-metallic soak process on the exposed surface of the low-k dielectric layer and the exposed surface of the metal line, wherein the organo-metallic soak process is performed using a process gas comprising a metal bonded to an organic group.

2. The method of claim 1 further comprising:
    forming an opening in the low-k dielectric layer;
    filling the opening with a metallic material; and
    before the UV treatment, performing a Chemical Mechanical Polish (CMP) on the metallic material to form the metal line in the low-k dielectric layer, wherein the exposed surface of the low-k dielectric layer and the exposed surface of the metal line are exposed after the CMP, and are level with each other.

3. The method of claim 2 further comprising:
    after the CMP, performing a pre-heating step on the exposed surface of the low-k dielectric layer and the exposed surface of the metal line; and
    after the CMP, performing a pre-treatment on the exposed surface of the low-k dielectric layer and the exposed surface of the metal line using ammonia as a treatment gas.

4. The method of claim 1 further comprising:
    after the organo-metallic soak process, performing an anneal on the low-k dielectric layer and the metal line; and
    after the anneal, forming a dielectric etch stop layer over the low-k dielectric layer and the metal line.

5. The method of claim 4, wherein the anneal is performed without plasma.

6. The method of claim 1, wherein the process gas comprises aluminum bonded to $CH_3$.

7. The method of claim 1 further comprising, after the organo-metallic soak process, performing a pin treatment on the exposed surface of the low-k dielectric layer and the exposed surface of the metal line, wherein ammonia is used as a process gas.

8. A method comprising:
performing a cycle comprising:
performing an organo-metallic soak process on an exposed surface of a low-k dielectric layer and an exposed surface of a metal line; and
performing a pin treatment on the exposed surface of the low-k dielectric layer and the exposed surface of the metal line;
after the cycle, performing an anneal on the low-k dielectric layer and the metal line; and
after the anneal, forming a dielectric etch stop layer over the low-k dielectric layer and the metal line.

9. The method of claim 8 further comprising, before the cycle is performed, performing a Ultra-Violet (UV) treatment on the exposed surface of the low-k dielectric layer and the exposed surface of the metal line.

10. The method of claim 8 further comprising:
forming an opening in the low-k dielectric layer;
filling the opening with a metallic material; and
before the cycle is performed, performing a Chemical Mechanical Polish (CMP) on the metallic material to form the metal line in the low-k dielectric layer, wherein the exposed surface of the low-k dielectric layer and the exposed surface of the metal line are exposed after the CMP, and are level with each other.

11. The method of claim 10 further comprising:
after the CMP, performing a pre-heating on the exposed surface of the low-k dielectric layer and the exposed surface of the metal line; and
after the CMP, performing a pre-treatment on the exposed surface of the low-k dielectric layer and the exposed surface of the metal line using ammonia as a treatment gas.

12. The method of claim 8, wherein the organo-metallic soak process is performed using a process gas comprising aluminum bonded to $CH_3$, and wherein the pin treatment is performed using ammonia as a treatment gas.

13. The method of claim 8, wherein the pin treatment is performed using plasma, and wherein the anneal is performed without plasma.

14. The method of claim 8 further comprising, after the cycle is performed and before the anneal, performing a plurality of cycles, each comprising:
an additional organo-metallic soak process on the exposed surface of the low-k dielectric layer and the exposed surface of the metal line; and
an additional pin treatment on the exposed surface of the low-k dielectric layer and the exposed surface of the metal line.

15. A method comprising:
performing a Chemical Mechanical Polish (CMP) to form a metal line in a low-k dielectric layer;
after the CMP, performing a Ultra-Violet (UV) treatment on an exposed surface of the low-k dielectric layer and an exposed surface of the metal line;
after the UV treatment, performing a cycle comprising:
performing an organo-metallic soak process on the exposed surface of the low-k dielectric layer and the exposed surface of the metal line, wherein a process gas for the organo-metallic soak process comprises $Al(CH_3)_3$; and
performing a pin treatment on the exposed surface of the low-k dielectric layer and the exposed surface of the metal line, wherein ammonia is used as a process gas;
after the cycle, performing an anneal on the low-k dielectric layer and the metal line; and
after the anneal, forming a dielectric etch stop layer over the low-k dielectric layer and the metal line.

16. The method of claim 15 further comprising, after the CMP and before the cycle: performing a pre-heating on the exposed surface of the low-k dielectric layer and the exposed surface of the metal line; and
performing a pre-treatment on the exposed surface of the low-k dielectric layer and the exposed surface of the metal line using ammonia as a treatment gas.

17. The method of claim 15, wherein the UV treatment is performed using a process gas comprising hydrogen ($H_2$).

18. The method of claim 15, wherein the UV treatment is performed at a temperature between about 300° C. and about 400° C.

19. The method of claim 15, wherein the anneal is performed at an elevated temperature and without using plasma.

20. The method of claim 15, wherein the anneal is performed at temperatures between about 300° C. and about 400° C.

* * * * *